(12) United States Patent
You et al.

(10) Patent No.: US 11,901,497 B2
(45) Date of Patent: Feb. 13, 2024

(54) METHOD OF REPAIRING LIGHT EMITTING DEVICE, APPARATUS FOR REPAIRING LIGHT EMITTING DEVICE, AND DISPLAY PANEL HAVING REPAIRED LIGHT EMITTING DEVICE

(71) Applicant: SEOUL VIOSYS CO., LTD., Ansan-si (KR)

(72) Inventors: Ik Kyu You, Ansan-si (KR); Jung Jae Lee, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 146 days.

(21) Appl. No.: 17/131,618

(22) Filed: Dec. 22, 2020

(65) Prior Publication Data

US 2021/0193894 A1    Jun. 24, 2021

Related U.S. Application Data

(60) Provisional application No. 62/964,440, filed on Jan. 22, 2020, provisional application No. 62/953,399, filed on Dec. 24, 2019.

(51) Int. Cl.
*H01L 33/62* (2010.01)
*H01L 25/075* (2006.01)

(52) U.S. Cl.
CPC .......... *H01L 33/62* (2013.01); *H01L 25/0753* (2013.01)

(58) Field of Classification Search
CPC ................ H01L 33/62; H01L 25/0753; H01L 2933/0066
See application file for complete search history.

(56) References Cited

U.S. PATENT DOCUMENTS

| 2012/0112220 A1* | 5/2012 | West | H01L 33/62 257/E33.072 |
| 2015/0209914 A1* | 7/2015 | Ishigami | B23K 1/0016 148/24 |
| 2016/0163940 A1* | 6/2016 | Huang | H01L 25/0756 257/89 |

(Continued)

FOREIGN PATENT DOCUMENTS

| EP | 3460861 A2 | 3/2019 |
| KR | 10-2018-0120527 | 11/2018 |
| KR | 10-2019-0018385 | 2/2019 |

OTHER PUBLICATIONS

International Search Report dated Apr. 21, 2021, issued to PCT/KR2020/019107 (with English Translation).

(Continued)

*Primary Examiner* — Victor A Mandala
(74) *Attorney, Agent, or Firm* — Oblon, McClelland, Maier & Neustadt, L.L.P.

(57) ABSTRACT

A display panel including a circuit board including first pads, first light emitting devices disposed on the circuit board and including pads, at least one second light emitting device disposed on the circuit board and including pads, metal bonding layers disposed between the pads of the first light emitting devices and the first pads on the circuit board, and a conductive material layer electrically connecting the pads of the second light emitting device to the first pads on the circuit board, in which the conductive material layer includes a conductive portion and a non-conductive portion.

16 Claims, 14 Drawing Sheets

(56) References Cited

U.S. PATENT DOCUMENTS

| | | | |
|---|---|---|---|
| 2016/0190105 A1* | 6/2016 | Rhee | H05B 33/145 |
| | | | 257/76 |
| 2016/0313848 A1* | 10/2016 | Rhee | H01L 25/0753 |
| 2017/0263811 A1 | 9/2017 | Zou et al. | |
| 2018/0122786 A1* | 5/2018 | Wu | H01L 25/075 |
| 2018/0190876 A1* | 7/2018 | Liu | H01L 33/62 |
| 2018/0277524 A1* | 9/2018 | Moon | H01L 25/0753 |
| 2019/0081200 A1 | 3/2019 | Ting et al. | |
| 2019/0131282 A1* | 5/2019 | Liu | H01L 24/81 |
| 2019/0157537 A1* | 5/2019 | Namiki | H01L 25/0753 |
| 2019/0181122 A1* | 6/2019 | Hsu | H01L 33/62 |
| 2019/0198735 A1* | 6/2019 | Tsai | H01L 33/54 |
| 2019/0245120 A1* | 8/2019 | Choi | H01L 33/58 |
| 2019/0252579 A1* | 8/2019 | Choi | H01L 33/50 |
| 2019/0295996 A1* | 9/2019 | Park | H01L 33/502 |
| 2019/0348588 A1* | 11/2019 | Hsieh | H01L 33/62 |
| 2019/0385991 A1* | 12/2019 | Kim | H01L 25/0753 |
| 2020/0075820 A1* | 3/2020 | Han | H01L 25/0753 |
| 2020/0083415 A1* | 3/2020 | Kim | H01L 25/167 |
| 2020/0091385 A1* | 3/2020 | Hsieh | H01L 33/62 |
| 2020/0235084 A1* | 7/2020 | Wu | H01L 33/46 |
| 2021/0136966 A1 | 5/2021 | Jang et al. | |
| 2022/0415859 A1* | 12/2022 | Choi | H01L 25/0753 |

OTHER PUBLICATIONS

European Search Report dated Jan. 4, 2024, in corresponding European Application No. 20908058.9.

* cited by examiner

METHOD OF REPAIRING LIGHT EMITTING DEVICE, APPARATUS FOR REPAIRING LIGHT EMITTING DEVICE, AND DISPLAY PANEL HAVING REPAIRED LIGHT EMITTING DEVICE

CROSS REFERENCE TO RELATED APPLICATIONS

This application claims the benefit of U.S. Provisional Patent Application No. 62/953,399 filed on Dec. 24, 2019, and U.S. Provisional Patent Application No. 62/964,440, filed on Jan. 22, 2020, each of which is hereby incorporated by reference for all purposes as if fully set forth herein

BACKGROUND

Field

Exemplary embodiments of the invention relate generally to a method of repairing a light emitting device, an apparatus for repairing a light emitting device, a display panel having the repaired light emitting device, and a display apparatus having the same. More particularly, exemplary embodiments of the invention relate generally to a method of repairing micro LEDs, an apparatus for repairing micro LEDs, a display panel having the repaired micro LEDs, and a display apparatus having the same.

Discussion of the Background

As an inorganic light source, light emitting diodes have been used in various fields including displays, vehicular lamps, general lighting, and the like. With various advantages such as long lifespan, low power consumption, and rapid response, light emitting diodes have been replacing existing light sources in the art.

Meanwhile, conventional light emitting diodes have been mainly used as backlight light sources in display apparatuses. However, recently, small-sized light emitting diodes, that is, LED display apparatuses that directly implement an image using micro LEDs, have been developed.

In general, a display apparatus realizes various colors through mixture of blue, green and red light. In order to realize various images, the display apparatus includes a plurality of pixels, each of which includes sub-pixels corresponding to blue, green and red light, respectively, in which a color of a certain pixel is determined based on the colors of the sub-pixels so that images can be realized through combination of such pixels.

LEDs can emit light of various colors depending on their materials, and a display apparatus in which individual micro LEDs emitting blue, green, and red are arranged on a two-dimensional plane, or a display apparatus in which micro LEDs having a stacked structure in which a blue LED, a green LED, and a red LED are stacked one above another are arranged on a two-dimensional plane may be provided.

Micro LEDs used in one display apparatus usually require more than one million even for a small-sized display. Due to the small size of micro LEDs and the enormous number required, mass production of micro LED display apparatus according to a conventional technology is almost impossible because of the conventional die bonding technology in which LED chips are individually mounted. As such, a technology for transferring a plurality of micro LEDs onto a circuit board in a group has been recently developed.

Meanwhile, some of the micro LEDs transferred in a group may exhibit bonding failure or poor luminescence characteristics. These defective micro LEDs need to be repaired. Generally, repairment of micro LEDs is to replace defective micro LEDs with favorable micro LEDs, and repairment of micro LEDs is quite difficult due to the small size of the micro LEDs.

The above information disclosed in this Background section is only for understanding of the background of the inventive concepts, and, therefore, it may contain information that does not constitute prior art.

SUMMARY

Methods according to exemplary embodiments of the invention are capable of repairing a light emitting device for a display, particularly micro LEDs.

Exemplary embodiments provide an apparatus for repairing a light emitting device for a display, particularly micro LEDs.

Additional features of the inventive concepts will be set forth in the description which follows, and in part will be apparent from the description, or may be learned by practice of the inventive concepts.

A display panel according to an exemplary embodiment includes a circuit board including first pads, first light emitting devices disposed on the circuit board and including pads, at least one second light emitting device disposed on the circuit board and including pads, metal bonding layers disposed between the pads of the first light emitting devices and the first pads on the circuit board, and a conductive material layer electrically connecting the pads of the second light emitting device to the first pads on the circuit board, in which the conductive material layer includes a conductive portion and a non-conductive portion.

The conductive material layer may include at least one of an anisotropic conductive film, an anisotropic conductive paste, and an anisotropic conductive adhesive.

The conductive portion of the conductive material layer may include conductive balls disposed between the pads of the second light emitting device and the pads of the circuit board.

The metal bonding layer may include at least one of AuSn, CuSn, and In.

An upper surface of the second light emitting device may be disposed higher than those of the first light emitting devices.

Each of the first and second light emitting devices may be configured to emit each of blue light, green light, and red light.

The conductive material layer may contact the first light emitting device adjacent to the second light emitting device.

The conductive material layer may be spaced apart from adjacent first light emitting devices.

The conductive material layer may have a wider width than that of the corresponding second light emitting device.

A method of repairing a light emitting device according to another exemplary embodiment includes removing at least one defective light emitting device among a plurality of light emitting devices transferred onto a circuit board, and mounting a second light emitting device at a location of the circuit board where the defective light emitting device is removed using a conductive material layer, in which the conductive material layer includes a conductive portion and a non-conductive portion.

Mounting the second light emitting device may include disposing the conductive material layer at the location of the circuit board where the defective light emitting device is removed, disposing the second light emitting device on the conductive material layer, and curing the conductive material layer.

Disposing the second light emitting device may include forming the second light emitting device on a substrate, and transferring the second light emitting device disposed on the substrate to the conductive material layer, and the substrate may be removed from the second light emitting device after the conductive material layer is cured.

The substrate may include a single second light emitting device.

A plurality of defective light emitting devices on the circuit board may be repaired using a plurality of substrates each including the single second light emitting devices, respectively.

The method may further include forming bonding material layers on first pads of the circuit board, respectively, disposing the first light emitting devices on the bonding material layers, and forming metal bonding layers by applying heat to the bonding material layers.

The defective light emitting device may be removed by applying gas to the first light emitting device using a gas blower.

The gas blower may apply the gas to the first light emitting device at a predetermined pressure.

The gas may be applied to each of the first light emitting devices transferred onto the circuit board using the gas blower.

The defective light emitting device may be detected in advance, and the gas may be applied only to the defective light emitting device using the gas blower.

An apparatus for repairing a light emitting device according to yet another exemplary embodiment includes a first table to support a circuit board on which first light emitting devices are mounted, a second table to support a temporary substrate to which second light emitting devices are adhered, a third table to support a bath including a conductive adhesive material, and a pickup unit configured to pick up at least one of the second light emitting devices from the temporary substrate and place the at least one of the second light emitting devices on the circuit board.

The pickup unit may include a needle to pick up the second light emitting device from the temporary substrate.

The needle may have a passage to vacuum-adsorb the second light emitting device.

The apparatus may further include a moving device to move the needle in the vertical direction.

The first, second, and third tables may be configured to move laterally with respect to the pickup unit.

The apparatus may further include at least one vision device.

The at least one vision device may include a first vision device configured to be placed over the first, second, and third tables, and a second vision device configured to be placed under the first, second, and third tables.

The apparatus may further include a display configured to display an image photographed using the vision device.

At least one of the first table and the pickup unit may be configured to vibrate in the lateral direction to separate at least one of the light emitting devices from the circuit board.

The conductive adhesive material may include at least one of an anisotropic conductive paste and an anisotropic conductive adhesive.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
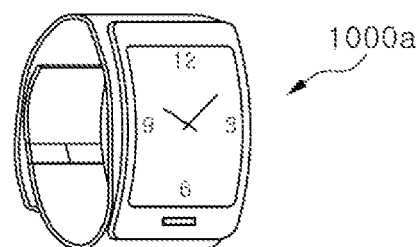
FIG. 1 shows schematic perspective views of display apparatuses according to exemplary embodiments.
Figure 1:
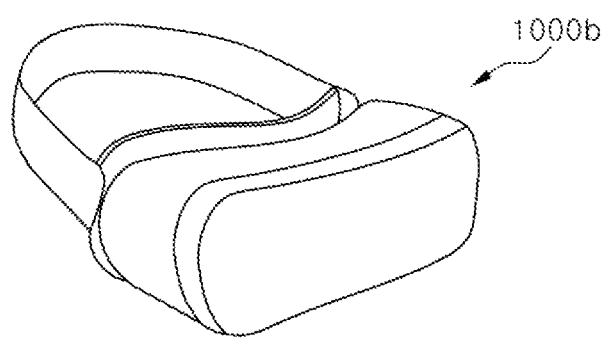
Figure 1:
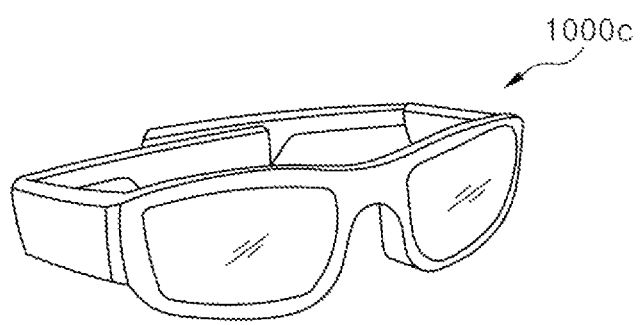

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the inventive concepts will be described in detail with reference to the accompanying drawings.

FIG. 1 shows schematic perspective views of display apparatuses according to exemplary embodiments.

The light emitting device according to an exemplary embodiments may be used in a VR display apparatus such as a smart watch 1000a or a VR headset 1000b, or an AR display apparatus such as augmented reality glasses 1000c, without being limited thereto.

Figure 2:
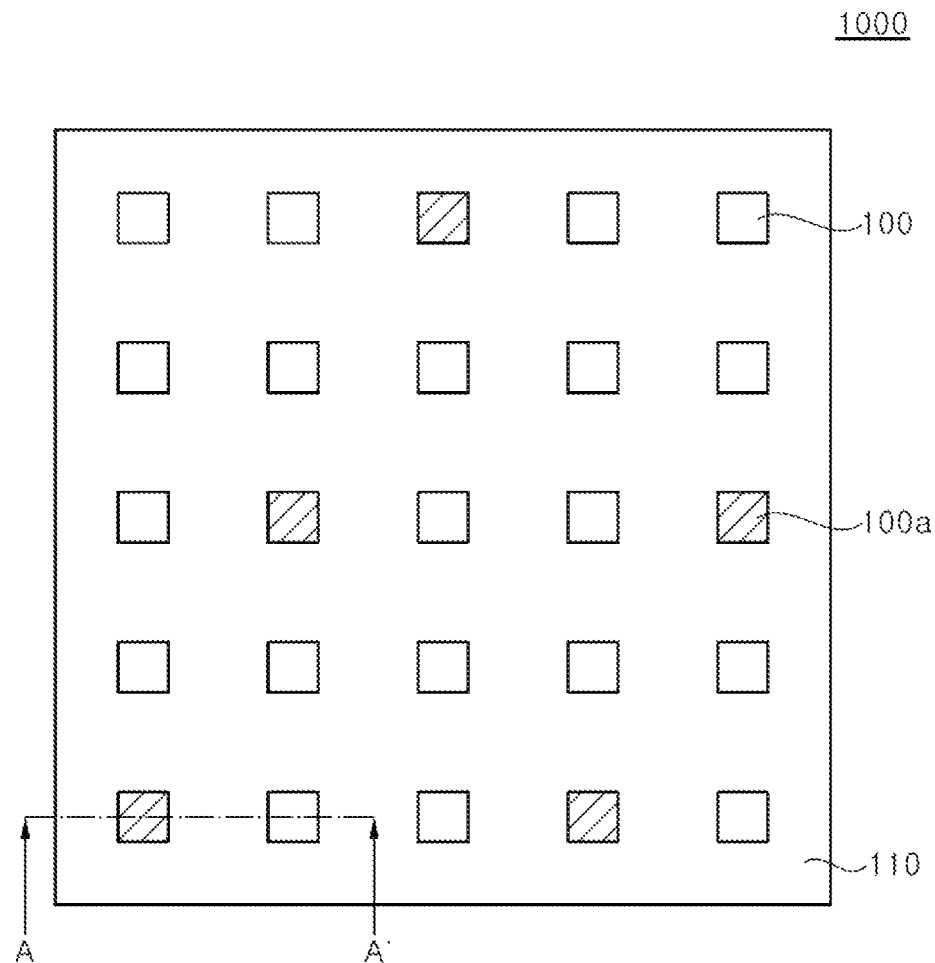
FIG. 2 is a schematic plan view of a display panel according to an exemplary embodiment.

A display panel for displaying an image is mounted on a display apparatus. FIG. 2 is a schematic plan view of a display panel 1000 according to an exemplary embodiment, and FIG. 3 is a schematic enlarged partial cross-sectional view taken along line A-A' of FIG. 2.

Figure 3:
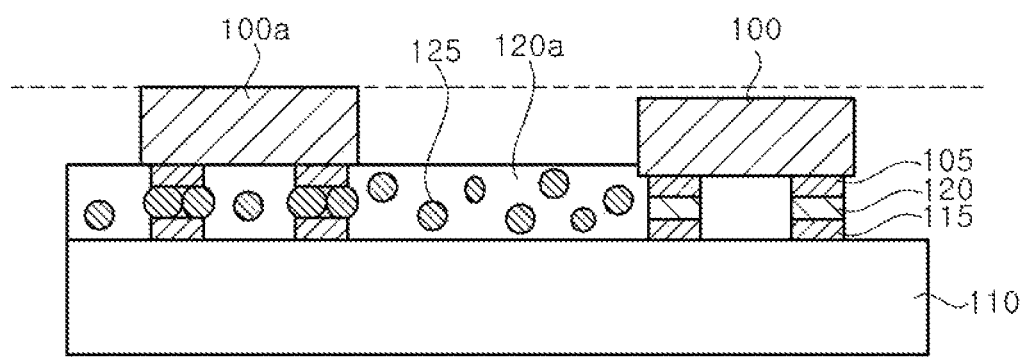
FIG. 3 is a schematic enlarged partial cross-sectional view taken along line A-A' of FIG. 2 according to an exemplary embodiment.

Referring to FIGS. 2 and 3, the display panel 1000 includes a circuit board 110 and light emitting devices 100 and 100a. The light emitting devices 100 and 100a may be small-sized LEDs, commonly referred to as micro LEDs. For example, the light emitting device 100 may have a size smaller than 500 μm×500 μm, and further, smaller than 100 μm×100 μm. However, the inventive concepts are not limited to a particular size of the light emitting device 100.

The circuit board 110 may include a circuit for passive matrix driving or active matrix driving. In an exemplary embodiment, the circuit board 110 may include interconnection lines and resistors therein. In another exemplary embodiment, the circuit board 110 may include interconnection lines, transistors, and capacitors. The circuit board 110 may also have pads disposed on an upper surface thereof to allow electrical connection to the circuit therein.

A plurality of light emitting devices 100 and 100a is arranged on the circuit board 110. The light emitting device 100 represents a light emitting device of good performance mounted on the circuit board 110 by group transfer, and the light emitting device 100a represents a repaired light emitting device. A structure of the light emitting device 100a may be substantially the same as that of the light emitting device 100, but the inventive concepts are not limited thereto. An interval between the light emitting devices 100 and 100a may be at least wider than a width of the light emitting device 100 or 100a.

In an exemplary embodiment, the light emitting devices 100 and 100a may be sub-pixels that emit light of a specific color, and the sub-pixels may form one pixel. For example, a blue LED, a green LED, and a red LED may be adjacent to one another to form one pixel. However, the inventive concepts are not limited thereto, and each of the light emitting devices 100 and 100a may have a stacked structure emitting light of various colors. For example, each of the light emitting devices 100 and 100a may have a structure in which a blue LED, a green LED, and a red LED are stacked to overlap one another, and thus, one light emitting device 100 and 100a may form one pixel.

The light emitting device 100 may have pads 105, and the pads 105 may be adhered to corresponding pads 115 of the circuit board 110 through a bonding layer 120. The bonding layer 120 may be formed by solder bonding, and may include, for example, a metallic bonding material such as AuSn, CuSn, In, or the like.

The light emitting device 100a may have pads 105, and the pads 105 may be adhered to the corresponding pads 115 of the circuit board 110 through a conductive material layer 120a. The conductive material layer 120a includes a conductive portion and a non-conductive portion. The conductive material layer 120a may be formed using, for example, an anisotropic conductive film (ACF), an anisotropic conductive paste (ACP), or an anisotropic conductive adhesive (ACA). The light emitting device 100a may be electrically connected to the circuit board 110 by conductive balls 125 in the conductive material layer 120a.

The conductive material layer 120a may be in contact with an adjacent light emitting device 100 as shows, but the inventive concepts are not limited thereto. In some exemplary embodiments, the conductive material layer 120a may be spaced apart from the light emitting device 100.

In an exemplary embodiment, an upper surface of the light emitting device 100a may be placed higher than that of the light emitting device 100. In particular, the conductive material layer 120a located under the pads 105 of the light emitting device 100a may be thicker than the bonding layer 120.

The display panel 1000 may include at least one light emitting device 100a, and the light emitting device 100a bonded to the circuit board 110 by the conductive material layer 120a may be distinguished from the light emitting device 100 bonded to the circuit board 110 by the bonding layer 120, which may include a metallic material.

FIGS. 4A, 4B, 4C, 4D, and 4E are schematic cross-sectional views illustrating a process of repairing a micro LED according to exemplary embodiments.

Figure 4A:
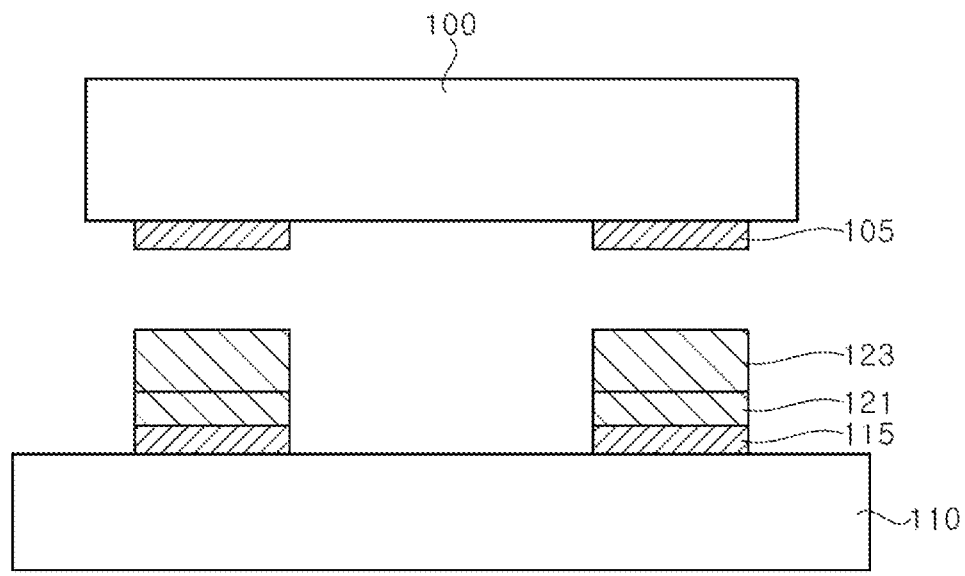
FIGS. 4A, 4B, 4C, 4D, and 4E are schematic cross-sectional views illustrating a process of repairing a light emitting device according to exemplary embodiments.

Referring to FIG. 4A, a circuit board 110 includes pads 115. The pads 115 are connected to circuits in the circuit board 110 and provide contact points for connecting a light emitting device 100 to the circuits. The pads 115 are disposed in each region of the circuit board 110 where the light emitting devices 100 are to be mounted to mount a plurality of light emitting devices 100. The pads 115 may be formed of a metal layer including Au. For example, the pads 115 may have a multilayer structure of Cu/Ni/Au.

Barrier layers 121 are provided on the pads 115, and bonding material layer 123 is provided on the barrier layer 121. The barrier layers 121 may prevent the bonding material layers 123 from diffusing into the pads 115, thereby preventing damage to the pads 115. The barrier layer 121 may be a metal layer mixed with the bonding material layer 123, or a metal layer for blocking diffusion of the bonding material layer 123. For example, the barrier layer 121 may include at least one of Ni, Cr, Ti, Ta, Mo, and W. For example, the barrier layer 121 may have a multilayer structure of Cr/Ni or Ti/Ni.

The bonding material layer 123 may include AuSn, CuSn, or In. In general, the bonding material layers 123 are provided on the pads 115 for group transfer using micro LED technology. The bonding material layer 123 may be formed using, for example, a solder paste including flux and a metallic material. The bonding material layer 123 may be formed on the pads 115 using, for example, a screen printing technique.

In some exemplary embodiments, a metal layer mixed with the bonding material layer 123 such as an Au layer may be interposed between the barrier layer 121 and the bonding material layer 123.

The light emitting device 100 has pads 105. The pads 105 correspond to the pads 115 of the circuit board 110. As shown in the drawing, the pads 105 may be bump pads protruding from the light emitting device 100, but in some exemplary embodiments, the pads 105 may not necessarily have a protruding shape. The plurality of light emitting devices 100 may be transported to correspond to the pads 115 of the circuit board 110.

Figure 4B:
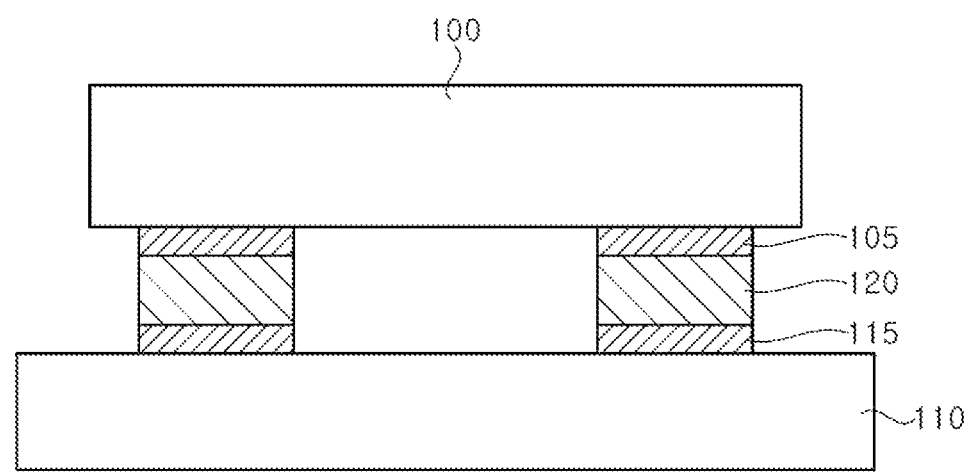

Referring to FIG. 4B, after the pads 105 of the light emitting device 100 are arranged on the bonding material layers 123 as shown in FIG. 4A, a metal bonding layer 120 is formed by applying heat at a bonding temperature. In particular, the barrier layer 121 and the bonding material layer 123 may be mixed with each other by heat, and at least a portion of the pads 105 may be mixed with the bonding material layer 123. In this manner, the light emitting device 100 may be stably attached to the circuit board 110 by the metal bonding layer 120.

Figure 4C:
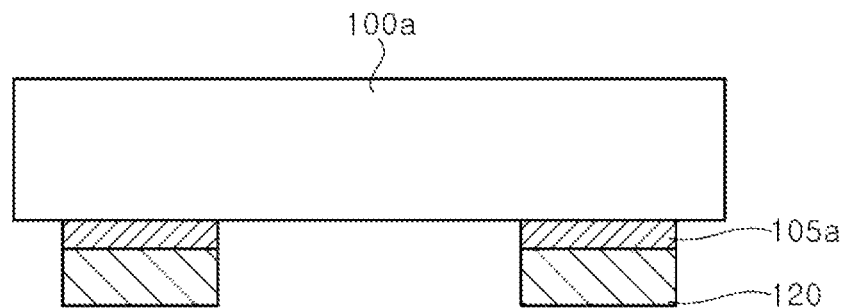

Referring to FIG. 4C, as described with reference to FIG. 4B, once the light emitting devices 100 are bonded to the circuit board 110, some of the light emitting devices 100 having defects may be detected. Such defects in the light emitting device 100 may be caused by, for example, bonding failure or by a failure in performance of the light emitting device 100.

In this case, a defective light emitting device 100 is removed from the circuit board 110. The light emitting device 100 having defective bonding may be removed using a gas blower 300, which will be described in more detail later with reference to FIG. 5A.

The bonding layer 120 may be removed together with the defective light emitting device 100, or the remaining bonding layer 120 may be separately removed using a laser or the like after the defective light emitting device 100 is removed. As such, the pads 115 may be retained on the circuit board 110 after the defective light emitting device 100 is removed. The remaining pads 115 may be substantially the same as the pads 115 before the light emitting device 100 is bonded, but may be deformed in some cases from the pads 115.

Figure 4D:
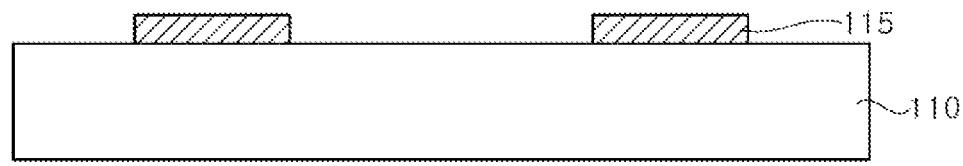

Referring to FIG. 4D, after the defective light emitting device 100 is removed, a conductive material layer 120a is formed on the exposed pads 115. The conductive material layer 120a may include conductive balls 125. The conductive material layer 120a may be, for example, an anisotropic conductive film, an anisotropic conductive paste, or an anisotropic conductive adhesive. For example, the conductive material layer 120a may be formed to cover the pads 115 by dispensing the anisotropic conductive paste or the anisotropic conductive adhesive.

Figure 4E:
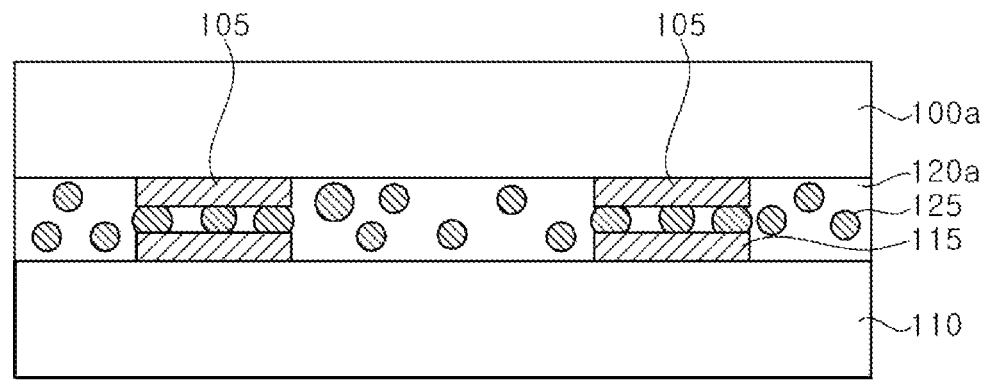

Referring to FIG. 4E, a light emitting device 100a for repairing is disposed on the conductive material layer 120a. The light emitting device 100a for repairing is disposed on the conductive material layer 120a so that the pads 105 of the light emitting device 100a for repairing match the pads 115 of the circuit board 110. The light emitting device 100a for repairing replaces the defective light emitting device 100, and may have performance required as the light emitting device 100. Further, the light emitting device 100a may have substantially the same structure as the light emitting device 100, but the inventive concepts are not limited thereto.

The pads 105 of the light emitting device 100a are electrically connected to the pads 115 of the circuit board 110 by the conductive balls 125. The light emitting device 100a may be pressed towards the circuit board 110, and thus, the conductive balls 125 may electrically connect the pads 105 and 115 to each other. The conductive material layer 120a may then be cured.

In general, handling of the light emitting device 100a is difficult due to its small size. As such, the light emitting device 100a may be formed on a substrate 20a which will be described in more detail later, and then be bonded to the circuit board 110 by handling the substrate 20a. The substrate 20a may be separated from the light emitting device 100a through a technique, such as laser lift-off, which will also be described in more detail later.

Hereinafter, a method of repairing a micro LED according to exemplary embodiments will be described in detail.

FIGS. 5A, 5B, 5C, and 5D are schematic cross-sectional views illustrating a method of repairing a micro LED according to an exemplary embodiment.

Figure 5A:
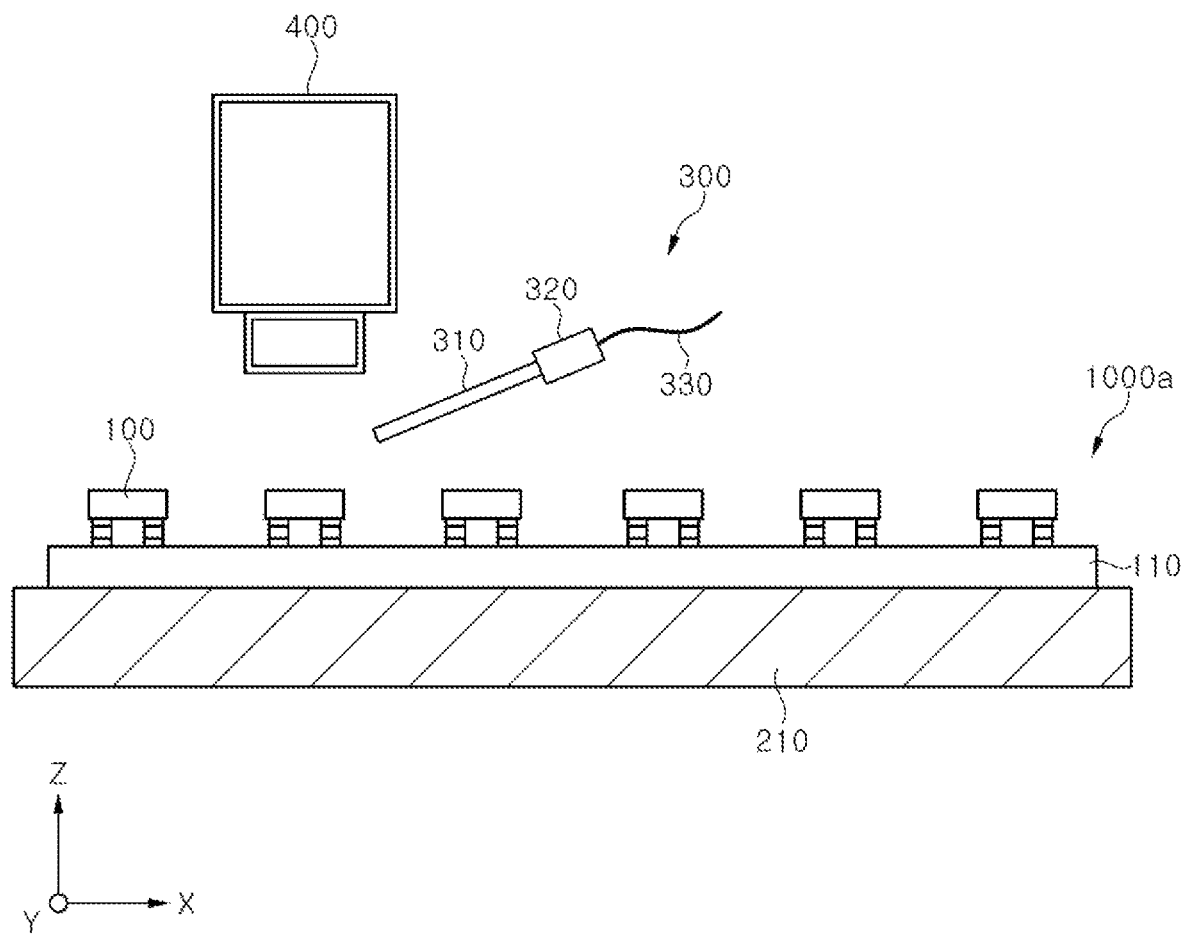
FIGS. 5A, 5B, 5C, and 5D are schematic cross-sectional views illustrating a method of repairing a light emitting device according to an exemplary embodiment.

Referring to FIG. 5A, a display panel 1000a in which light emitting devices 100 are transferred onto a circuit board 110 is prepared. The light emitting devices 100 may be formed on a wafer and transferred to the circuit board 110 in a group. The light emitting devices 100 may be transferred to the circuit board 110 using a laser lift-off technique, but the inventive concepts are not limited thereto. Various known methods of transferring the light emitting devices 100 onto the circuit board 110 may be used in other exemplary embodiments.

The display panel 1000a may be transported to a light emitting device removing apparatus to remove a defective light emitting device. In an exemplary embodiment, the removing apparatus may include a stage 210, a gas blower 300, and a camera 400. However, the inventive concepts are not limited to a particular removing apparatus.

The display panel 1000a may be placed on the stage 210 and may be clamped to be fixed on the stage 210. The stage 210 may be movable in the X and Y directions, and may also be movable in the Z direction. For example, when the display panel 1000a is transferred, the stage 210 may move downwardly in the Z direction to receive the display panel 1000a, and then move upwardly to remove the defective light emitting device 100.

The gas blower 300 may include a needle 310 having a gas outlet, a pressure control device 320, and a gas supply pipe 330. The needle 310 may have a gas outlet having a small inner diameter so as to blow gas toward the light emitting device 100. For example, the gas outlet may have an inner diameter of about 10 μm to about 50 μm.

The pressure control device 320 adjusts a pressure of gas to release gas at a pressure suitable for removing the light emitting device 100 having failed bonding.

In an exemplary embodiment, the defective light emitting device may be detected in advance before being placed in the light emitting device removing apparatus, and the removing apparatus may remove the light emitting devices 100 determined to have failed bonding. In another exemplary embodiment, the light emitting device 100 may be evaluated for a failure in bonding by releasing a gas pressure from the gas blower 300. For example, a gas pressure suitable for evaluating the bonding characteristics of the light emitting device 100 may be predetermined, and the pressure control device 320 may release gas at a predetermined pressure through the gas outlet. When gas is released at the predetermined pressure, the light emitting device 100 having failed bonding is removed while normal light emitting devices 100 are retained. In this manner, a separate process for determining defective light emitting devices 100 may be obviated.

The gas supply pipe 330 supplies gas to the pressure control device 320 from a storage tank storing gas. The gas supply pipe 330 may be a flexible tube to freely move a location of the needle 310, without being limited thereto.

In the illustrated exemplary embodiment, gas may be air or an inert gas, and in particular, may be an inert gas, such as He or $N_2$. The inert gas may not cause oxidation of a metal bonding layer.

The camera 400 may be disposed to observe the light emitting device 100 to which gas is applied from the needle 310. The camera 400 may be disposed above the light emitting device 100 to capture an image of the light emitting device 100 on the circuit board 110, but the inventive concepts are not limited thereto.

In the illustrated exemplary embodiment, although the stage 210 is exemplarily illustrated and described as being disposed under the gas blower 300 and the camera 400, but the inventive concepts are not limited thereto. In some exemplary embodiments, the stage 210 may be disposed above the camera 400 and the gas blower 300

The gas blower 300 applies gas to the light emitting device 100 through the needle 310. The gas blower 300 releases gas at a predetermined pressure using the pressure control device 320 to remove the light emitting device having failed bonding. In an exemplary embodiment, the gas blower 300 may apply gas only to light emitting devices 100 that are determined as defective light emitting devices among the light emitting devices 100 on the circuit board 110 for the removal. In another exemplary embodiment, the gas blower 300 may apply gas to all of the light emitting devices 100 on the circuit board 110 at a predetermined pressure and remove the light emitting devices having failed bonding.

The camera 400 observes whether the light emitting device 100 to which gas is applied by the gas blower 300 is attached or detached from the circuit board 110. A location where the light emitting device 100 is removed may be specified using the camera 400. When gas is applied to one light emitting device 100 and removes that light emitting device 100, the stage 210 may move in the lateral direction to apply gas to another light emitting device 100. In this manner, each of the light emitting devices having failed bonding among the light emitting devices 100 on the circuit board 110 may be removed using the gas blower 300.

Figure 5B:

FIG. 5B shows the circuit board 110 from which the light emitting devices having failed bonding are removed. When the defective light emitting devices 100 are removed, a metal bonding layer 120 corresponding thereto may also be removed while the corresponding pads 115 may be retained on the circuit board 110 at locations where the light emitting devices 100 have been removed.

Figure 5C:
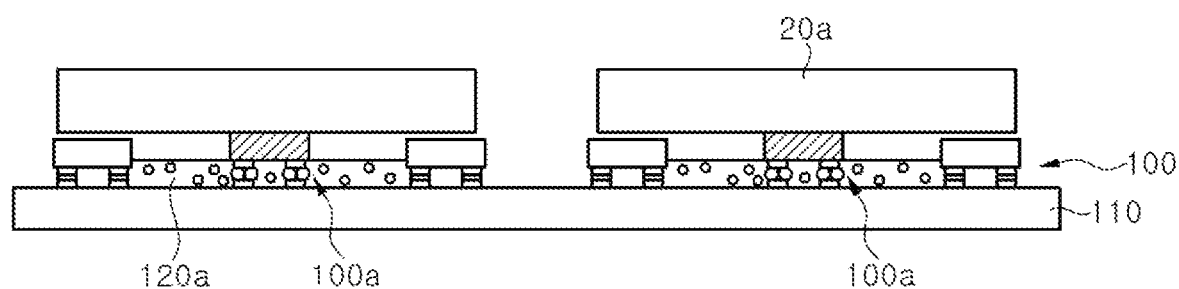

Referring to FIG. 5C, a conductive material layer 120a is disposed at the location where the light emitting device 100 is removed, and a light emitting device 100a for repairing is disposed thereon. The light emitting device 100a for repairing may be formed on a substrate 20a, and the light emitting device 100a may be disposed at a desired location by handling the substrate 20a. The substrate 20a may be a growth substrate for growing an epitaxial layer. For example, the substrate 20a may be a sapphire substrate, a silicon substrate, a GaAs substrate, or the like. The light emitting devices 100a may be manufactured using epitaxial layers grown on the substrate 20a, and may include a first conductivity type semiconductor layer, an active layer, and a second conductivity type semiconductor layer. Furthermore, the light emitting devices 100a may have a structure in which a plurality of LEDs is stacked.

A plurality of light emitting devices 100 may be removed from the circuit board 110, the conductive material layer 120a may be disposed at each of the locations where the light emitting devices 100 are removed, and the substrates 20a on which the light emitting devices 100a are formed may be disposed thereon, respectively. According to an exemplary embodiment, one light emitting device 100a may be formed on one substrate 20a, and thus, the substrates 20a are spaced apart from each other.

The light emitting device 100a for repairing may be pressed against the circuit board 110, and thus, pads 105 of the light emitting devices 100a and pads 115 on the circuit board 110 may be electrically connected.

The conductive material layer 120a may be cured by heat, and thus, the light emitting devices 100a may be adhered to the circuit board 110.

Figure 5D:
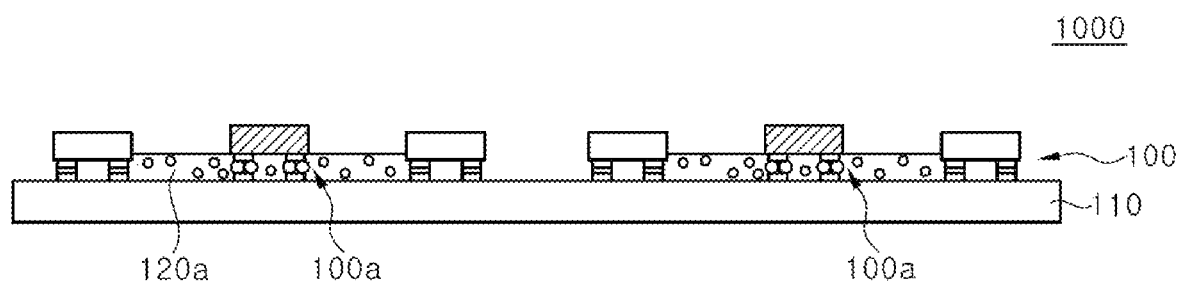

After the conductive material layer 120a is cured, the substrate 20a may be separated from the light emitting device 100a using the laser lift-off technique or the like. The display panel 1000 is completed as shown in FIG. 5D by separating each of the substrates 20a from the light emitting devices 100a.

In the illustrated exemplary embodiment, although the conductive material layers 120a disposed on the circuit board 110 to correspond to the light emitting devices 100a are exemplarily described as being simultaneously cured, the inventive concepts are not necessarily limited thereto.

For example, in some exemplary embodiments, each of the defective light emitting devices 100 on the circuit board 110 may be individually repaired by repeatedly performing a process of mounting the light emitting device 100a to the location where the defective light emitting device 100 is removed using each substrate 20a having the light emitting device 100a for repairing.

In the illustrated exemplary embodiment, an upper surface of the light emitting device 100a for repairing mounted on the circuit board 110 may be placed higher than that of the light emitting device 100. As such, damage to the light emitting devices 100 that have already been mounted on the circuit board 110 by the substrate 20a may be prevented. However, the inventive concepts are not limited thereto, and in some exemplary embodiments, elevations of upper surfaces of the light emitting devices 100 and 100a may be substantially the same.

A region between the light emitting devices 100 and 100a may be filled with a light reflecting material or a light blocking material such, as a black matrix, to prevent light interference between the light emitting devices 100 and 100a. In this case, the conductive material layer 120a may be disposed under the light blocking material.

Figure 6:
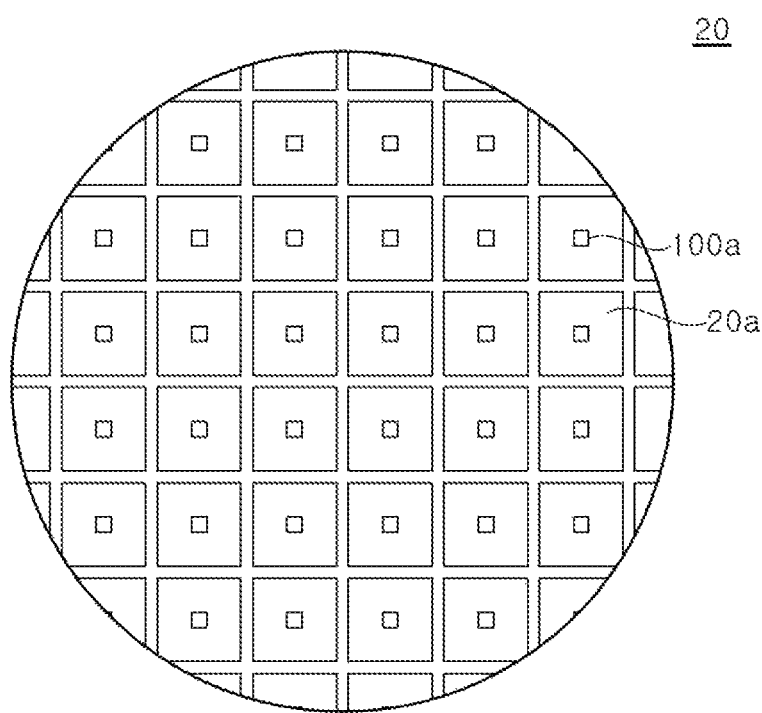
FIG. 6 is a schematic plan view illustrating light emitting devices for repairing according to an exemplary embodiment.

FIG. 6 is a schematic plan view of light emitting devices 100a for repairing according to an exemplary embodiment.

Referring to FIG. 6, a plurality of light emitting devices 100a for repairing may be formed on a wafer 20. The light emitting device 100a for repairing may be formed by forming epitaxial layers on a substrate 20a and patterning the epitaxial layers. A process of forming the light emitting device 100a for repairing is generally similar to that of forming the light emitting device 100, and thus, the light emitting devices 100a may have substantially the same or similar structure as that of the light emitting device 100. In an exemplary embodiment, the light emitting device 100a may have a structure including a single active layer to form one sub-pixel. In another exemplary embodiment, the light emitting device 100a may have an LED stacked structure having multiple active layers, and thus, may form one pixel.

The wafer 20 may be divided into a plurality of sections, and each section may include a single light emitting device 100a. The light emitting device 100a has a smaller size than the corresponding section, and thus, the substrate 20a of each section has a relatively large width compared to the light emitting device 100a.

The substrate 20a may have a size suitable for handling, and thus, the light emitting device 100a may be easily attached to the circuit board 110 using the substrate 20a. In addition, the light emitting device 100a may be easily transferred from the substrate 20a onto the circuit board 110 without damaging normal light emitting devices 100 mounted on the circuit board 110. As described above, the substrate 20a is separated from the light emitting device 100a during mounting process using a technique such as laser lift-off.

Figure 7:
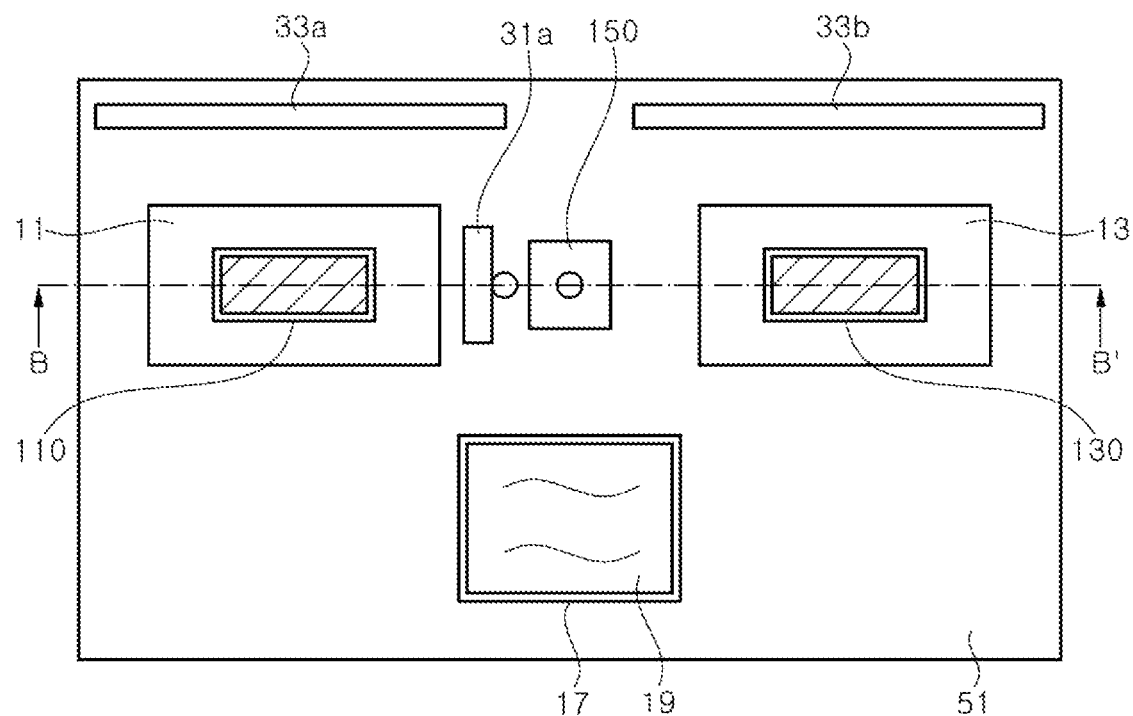
FIG. 7 is a schematic plan view of an apparatus for repairing a light emitting device according to an exemplary embodiment.
Figure 7:
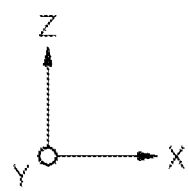
Figure 8:
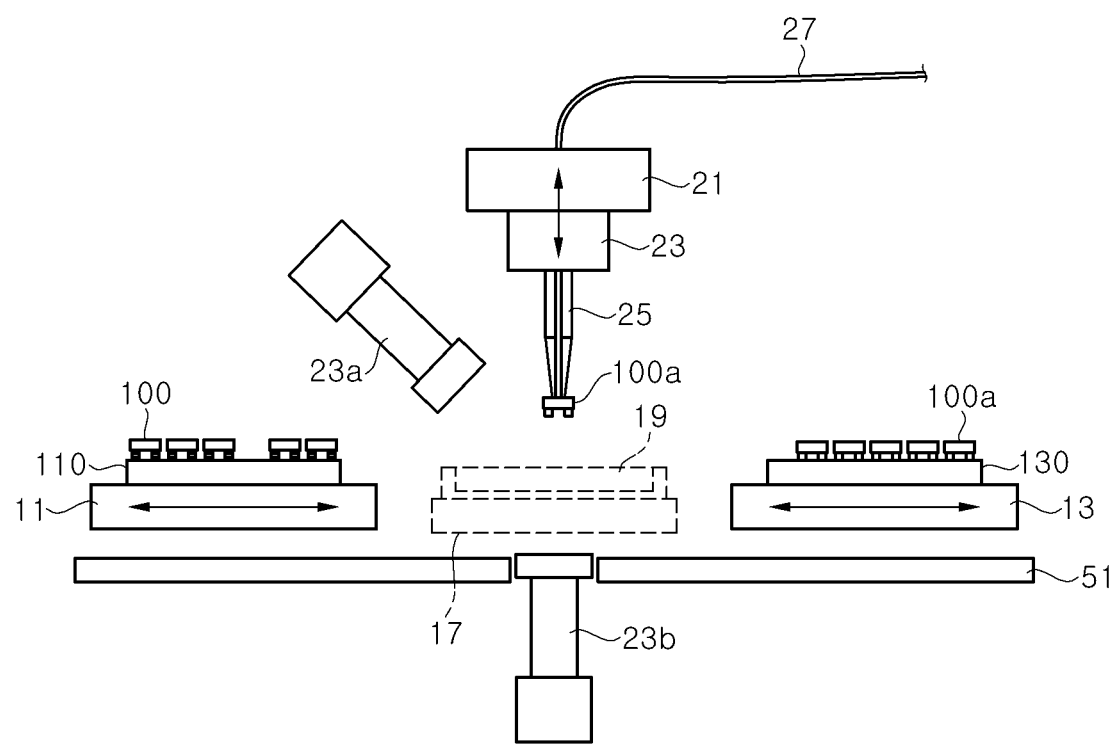
FIG. 8 is a schematic cross-sectional view taken along line B-B' of FIG. 7.

FIG. 7 is a schematic plan view of an apparatus 10 for repairing a light emitting device according to an exemplary embodiment, and FIG. 8 is a schematic cross-sectional view taken along line B-B' of FIG. 7.

Referring to FIGS. 7 and 8, the apparatus 10 may include a first table 11, a second table 13, a third table 17, a bath 19, and a first vision device 23a, a second vision device 23b23b, first and second displays 33a and 33b, a work station 51, a circuit board 110, a temporary substrate 130, and a pickup unit 150. The pickup unit 150 may include a moving device 21, a header 23, a needle 25, and an absorption pipe 27.

The work station 51 provides a space for carrying out a repairing operation of a light emitting device. The first, second, and third tables 11, 13, and 17 may be laterally and/or vertically movable on the work station 51. The first, second, and third tables 11, 13, and 17, for example, may be movable in the lateral direction (x, y direction) using a lateral direction moving part, and movable in the vertical direction (z direction) using a vertical direction moving part.

The first table 11 may move back and forth in the lateral direction, for example, in the x direction. The circuit board 110 on which the light emitting devices 100 are mounted may be disposed on the first table 11. The first table 11 may be movable so that the circuit board 110 can be placed under a lower portion of the needle 25 of the pickup unit 150, or the circuit board 110 can be spaced far apart from the lower portion of the needle 25 of the pickup unit 150.

The first table 11 may also be movable in the vertical direction, that is, in the z direction, so that an elevation of the first table 11 may be adjusted.

The second table 13 may move back and forth in the lateral direction, for example, in the x direction. The temporary substrate 130 on which light emitting devices 100*a* for repairing are mounted may be disposed on the second table 13. The second table 13 may be movable so that the temporary substrate 130 can be placed under the lower portion of the needle 25 of the pickup unit 150, or the temporary substrate 130 can be spaced far apart from the lower portion of the needle 25 of the pickup unit 150.

The second table 13 may also be movable in the vertical direction, that is, in the z direction, and thus, an elevation of the second table 13 may be adjusted.

The third table 17 may move back and forth in the lateral direction, for example, in the y direction. The bath 19 containing a conductive adhesive material may be disposed on the third table 17. The third table 17 may be movable so that the bath 19 can be placed under the lower portion of the needle, or the bath 19 can be spaced far apart from the lower portion of the needle 25.

The third table 17 may also be movable in the vertical direction, that is, in the z direction, and thus, an elevation of the third table 17 may be adjusted.

The circuit board 110 is disposed on the first table 11. The light emitting devices 100 are disposed on the circuit board 110. The light emitting devices 100 are mounted on the circuit board 110 by group transfer, and the circuit board 110 is disposed on the first table 11 with the light emitting devices 100 mounted thereon.

Some of the light emitting devices 100 mounted on the circuit board 110 are removed from the circuit board 110 due to failures in bonding, electrical, and/or optical properties. As such, some regions of the circuit board 110 may have empty space by removing the defective light emitting device 100.

The apparatus 10 is operated to place the light emitting device 100*a* for repairing at a location where the defective light emitting device 100 has been removed. When all of the defective light emitting devices 100 are replaced with the light emitting devices 100*a* for repairing, the circuit board 110 is transported from the first table 11 and a new circuit board 110 may be disposed on the first table 11.

The temporary substrate 130 is disposed on the second table 13. The light emitting devices 100*a* for repairing are disposed on the temporary substrate 130. The light emitting devices 100*a* for repairing may be transferred from a growth substrate onto the temporary substrate 130 using a technique such as laser lift-off. The temporary substrate 130 may include an adhesive material layer. The adhesive material layer may be, for example, an ultraviolet (UV) tape that may be cured by UV irradiation. The adhesiveness of the adhesive material layer may be reduced to, for example, about 1/100 or less when cured. After the light emitting devices 100*a* for repairing are transferred onto the temporary substrate 130, the adhesive material layer may be cured to facilitate separation of the light emitting devices 100*a* for repairing from the temporary substrate 130 by reduced adhesiveness of the adhesive material layer.

The bath 19 is disposed on the third table 17. The bath 19 may contain a conductive adhesive material for bonding the light emitting device 100*a* for repairing to the circuit board 110. The conductive adhesive material may be, for example, an anisotropic conductive paste (ACP) or an anisotropic conductive adhesive (ACA).

The first vision device 23*a* may be disposed over the work station 51. The first vision device 23*a* observes a location where the needle 25 is operated, and whether the circuit board 110, the temporary substrate 130, or the bath 19 is accurately disposed under the needle 25. The location of the light emitting device 100 on the circuit board 110 or the location of the light emitting device 100*a* on the temporary substrate 130 may be confirmed through the first vision device 23*a*.

The first vision device 23*a* may include a camera to photograph an object to be observed, and a photographed image may be checked through the first display 33*a*.

The second vision device 23*b* may be disposed to face the needle 25. The second vision device 23*b* may be disposed under the work station 51, and the work station 51 may include a groove for placing the second vision device 23*b*.

The second vision device 23*b* is disposed under the needle 25, and observes whether the needle 25 and the circuit board 110, or the needle 25 and the temporary substrate 130 are accurately arranged. The needle 25 may be arranged with the light emitting device 100*a* on the temporary substrate 130 to pick up the light emitting device 100*a*, and may also be arranged in a recovery space on the circuit board 110 to place the picked-up light emitting device 100*a* in an empty space on the circuit board 110. To this end, the second vision device 23*b* may provide a visual assistance to ensure proper placement of the needle 25.

For example, the second vision device 23*b* may include a camera to photograph an object to be observed, and a photographed image may be checked through the second display 33*b*.

The first and second displays 33*a* and 33*b* display the images photographed by the first and second vision devices 23*a* and 31*b*. In this manner, a user may visually check an operation state of the needle 25 using the displays 33*a* and 33*b*.

The circuit board 110 is disposed on the first table 11. The circuit board 110 may be laterally transported relative to the pickup unit 150 by lateral movement of the first table 11. In another exemplary embodiment, the pickup unit 150 may be laterally movable rather than the first table 11.

The circuit board 110 may include the light emitting devices 100 mounted by group transfer. In this case, some of the light emitting devices 100 mounted on the circuit board 110 may have mounting failure or defective electrical and optical properties. As such, the circuit board 110 may be transported to the apparatus 10 to replace the defective light emitting devices 100 with light emitting devices 100*a* for repairing.

When each of the defective light emitting devices 100 is replaced with the light emitting devices 100*a* for repairing, a display panel (2000 in FIG. 14) including the light emitting devices 100a for repairing and the light emitting devices 100 is provided.

The temporary substrate 130 is disposed on the second table 13. The temporary substrate 130 may be laterally transported relative to the pickup unit 150 by lateral movement of the second table 13. In another exemplary embodiment, the pickup unit 150 may be laterally movable rather than the second table 13.

The temporary substrate 130 supports the light emitting devices 100a for repairing. The temporary substrate 130 may include an adhesive material layer, such as a UV tape, and the light emitting devices 100a for repairing are attached to the adhesive material layer and supported by the temporary substrate 130.

The pickup unit 150 picks up the light emitting device 100a for repairing from the temporary substrate 130 and mounts the light emitting device 100a for repairing on the circuit board 110. The moving device 21 causes the needle 25 to move upward and downward, and to this end, the moving device 21 a step motor, for example. In an exemplary embodiment, the moving device 21 may move the needle 25 in the lateral direction.

The header 23 may be used to mount the needle 25, and is attached to the moving device 21 to move upward and downward by the moving device 21.

The needle 25 is operated to pick up the light emitting device 100a on the temporary substrate 130 and place the light emitting device 100a at a predetermined location on the circuit board 110. In an exemplary embodiment, the needle 25 may vacuum-adsorb the light emitting device 100a, and may detach the light emitting device 100a from the temporary substrate 130 using a vacuum-absorption force. To this end, the needle 25 may include a passage for vacuum-absorption.

The light emitting device 100a adsorbed by the needle 25 is at least partially immersed in the conductive adhesive material in the bath 19, and is thereafter bonded to pads of the circuit board 110. When the light emitting device 100a is bonded onto the circuit board 110, the needle 25 is separated from the light emitting device 100a. The needle 25 may be easily separated from the light emitting device 100a by injecting gas into the passage for vacuum-absorption.

The absorption pipe 27 is used to vacuum-exhaust the passage in the needle 25. The absorption pipe 27 may be connected to the moving device 21 or may be connected to the header 23. An absorption passage of the absorption pipe 27 is connected to the passage of the needle 25, and thus, when the needle 25 is disposed on an upper surface of the light emitting device 100a, the passage of the needle 25 may be vacuum-exhausted and the light emitting device 100a may be vacuum-adsorbed.

In the illustrated exemplary embodiment, although the needle 25 is exemplarily described as adsorbing the light emitting device 100a using vacuum-absorption, the inventive concepts are not limited thereto. In some exemplary embodiments, in addition to vacuum-absorption, the needle 25 may pick up the light emitting device 100a and detach the light emitting device 100a from the temporary substrate 130 using various known techniques.

Hereinafter, an operation of the apparatus 10 according to an exemplary embodiment will be described in more detail. In particular, a process for forming a display panel 2000a, and a process for removing the defective light emitting device from the display panel 2000a will be described. Subsequently, a process of providing the light emitting devices 100a for repairing on the temporary substrate 130, and a process for replacing the defective light emitting devices with the light emitting devices 100a for repairing replace using a conductive adhesive material will be described.

Figure 9:
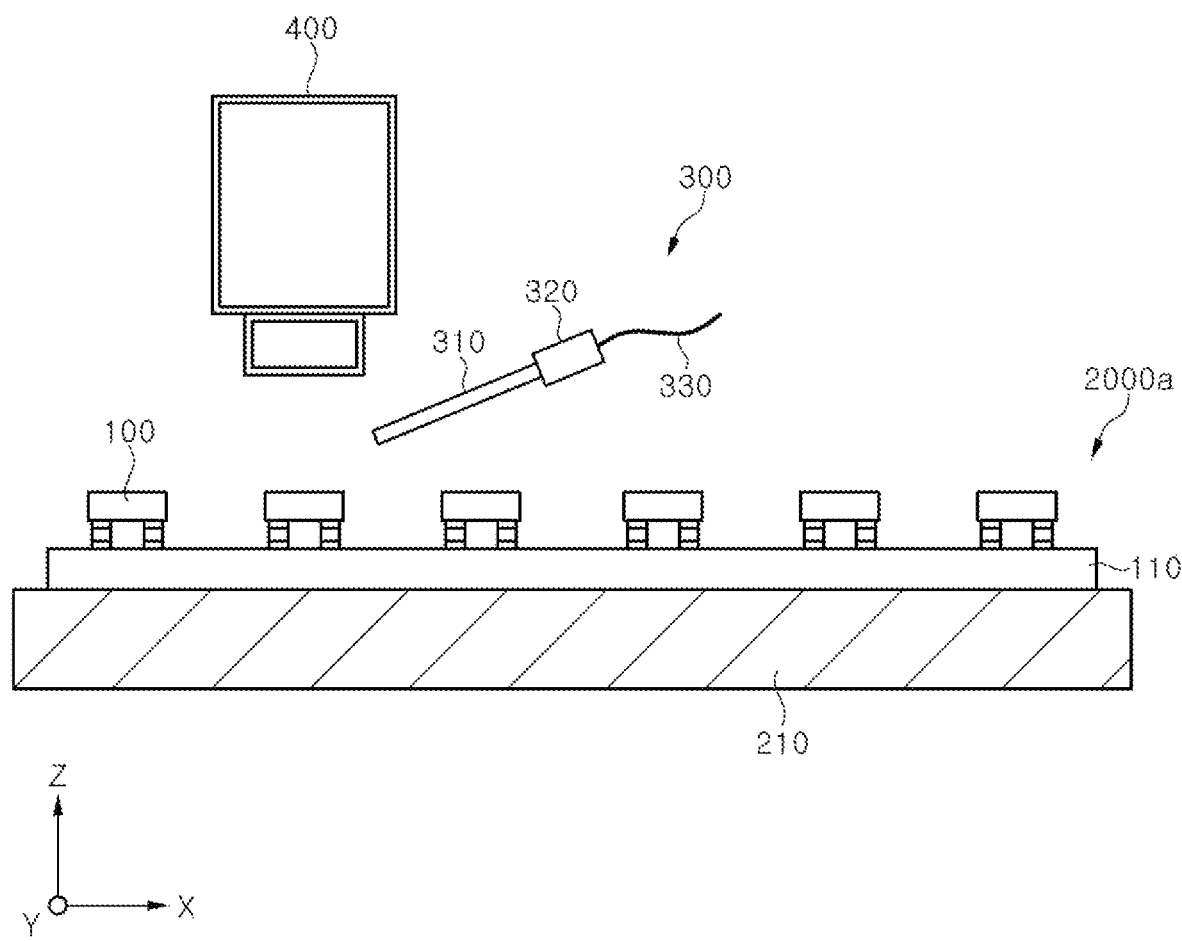
FIG. 9 is a schematic cross-sectional view illustrating a process of removing a defective device according to an exemplary embodiment.

FIG. 9 is a schematic cross-sectional view illustrating a process of removing a defective device according to an exemplary embodiment.

Referring to FIG. 9, the display panel 2000a including a circuit board 110 on which light emitting devices 100 are mounted is prepared. The light emitting devices 100 may be formed on a wafer and transferred to the circuit board 110 in a group. The light emitting devices 100 may be transferred to the circuit board 110 using a laser lift-off technique, but the inventive concepts are not limited thereto. In other exemplary embodiments, various known methods for transferring the light emitting devices 100 onto the circuit board 110 may be used. The process of bonding the light emitting device 100 to pads of the circuit board 110 will be described in more detail later with reference to FIGS. 10A and 10B.

The display panel 2000a may be placed in a light emitting device removing apparatus to remove a defective light emitting device. The removing apparatus is not particularly limited, and various known apparatuses to remove the defective light emitting device may be used. In an exemplary embodiment, the removing apparatus may include a stage 210, a gas blower 300, and a camera 400.

The display panel 2000a may be placed on the stage 210 and may be clamped to be fixed on the stage 210. The stage 210 may be movable in the X and Y directions, and may also be movable in the Z direction. For example, when the display panel 2000a is transported, the stage 210 may move downwardly in the Z direction to receive the display panel 2000a, and thereafter, move upwardly to remove the defective light emitting device 100.

The gas blower 300 may include a needle 310 having a gas outlet, a pressure control device 320, and a gas supply pipe 330. The needle 310 may have a gas outlet having a small inner diameter so as to blow gas toward the light emitting device 100. For example, the gas outlet may have an inner diameter of about 10 μm to about 50 μm.

The pressure control device 320 adjusts a pressure of gas to release gas at a pressure suitable for removing the defective light emitting device 100.

In an exemplary embodiment, whether the light emitting device 100 is defective may be detected in advance before being placed in the light emitting device removing apparatus, and the removing apparatus may remove the light emitting devices 100 determined to have failed bonding. In another exemplary embodiment, the light emitting device 100 may be evaluated for a failure in bonding by releasing a gas pressure from the gas blower 300. For example, a gas pressure suitable for evaluating the bonding characteristics of the light emitting device 100 may be predetermined, and the pressure control device 320 may release gas at a predetermined pressure through the gas outlet. When gas is released at the predetermined pressure, the light emitting device 100 having failed bonding is removed while normal light emitting device 100 are retained.

The gas supply pipe 330 supplies gas to the pressure control device 320 from a storage tank storing gas. The gas supply pipe 330 may be a flexible tube to freely move a location of the needle 310, without being limited thereto.

In the illustrated exemplary embodiment, gas may be air or an inert gas, and in particular, may be an inert gas, such as He or $N_2$. The inert gas may not cause oxidation of a metal bonding layer.

The camera 400 may be disposed to observe the light emitting device 100 to which gas is applied from the needle 310. The camera 400 may be disposed above the light emitting device 100 to capture an image of the light emitting device 100 on the circuit board 110, but the inventive concepts are not limited thereto.

In the illustrated exemplary embodiment, although the stage 210 is exemplarily illustrated and described as being disposed under the gas blower 300 and the camera 400, but the inventive concepts are not limited thereto. In some exemplary embodiments, the stage 210 may be disposed above the camera 400 and the gas blower 300.

The gas blower 300 applies gas to the light emitting device 100 through the needle 310. The gas blower 300 releases gas at a predetermined pressure using the pressure control device 320 to remove the light emitting device having failed bonding. In an exemplary embodiment, the gas blower 300 may apply gas only to light emitting devices 100 that are determined as defective light emitting devices among the light emitting devices 100 on the circuit board 110 for the removal. In this manner, since gas is not applied to each of the light emitting devices 100, a process time may be shortened. In another exemplary embodiment, the gas blower 300 may apply gas to all of the light emitting devices 100 on the circuit board 110 at a predetermined pressure and remove the light emitting devices having failed bonding.

The camera 400 observes whether the light emitting device 100 to which gas is applied by the gas blower 300 is attached or detached from the circuit board 110. A location where the light emitting device 100 is removed may be specified using the camera 400. When gas is applied to one light emitting device 100 and removes that light emitting device 100, the stage 210 may move in the lateral direction to apply gas to another light emitting device 100. In this manner, each of the light emitting devices having failed bonding among the light emitting devices 100 on the circuit board 110 may be removed using the gas blower 300.

Once each of the defective light emitting devices 100 are removed, the circuit board 110 may be placed on the first table 11 of the apparatus 10 described above.

Figure 10A:
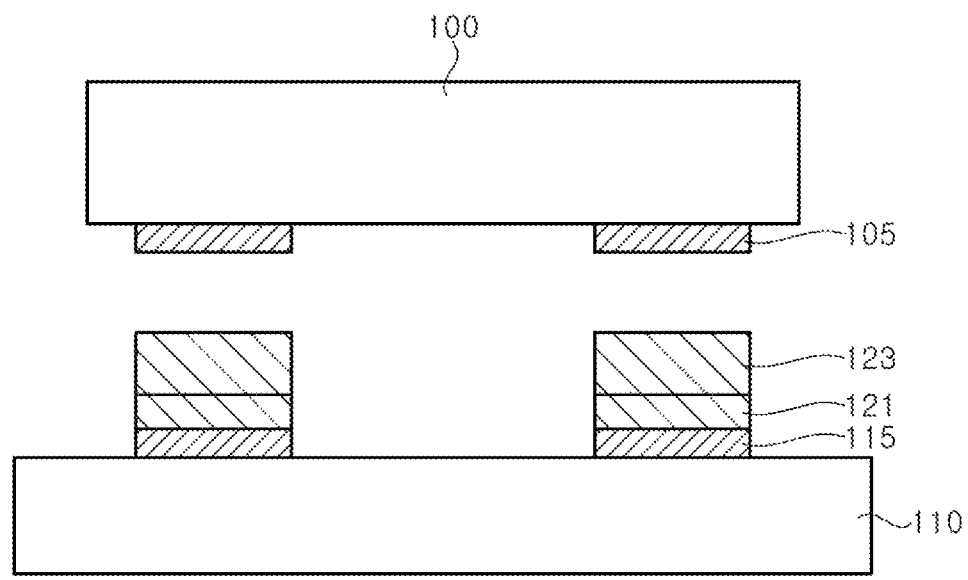
FIGS. 10A and 10B are schematic cross-sectional views illustrating a process of transferring a light emitting device according to an exemplary embodiment.
Figure 10B:
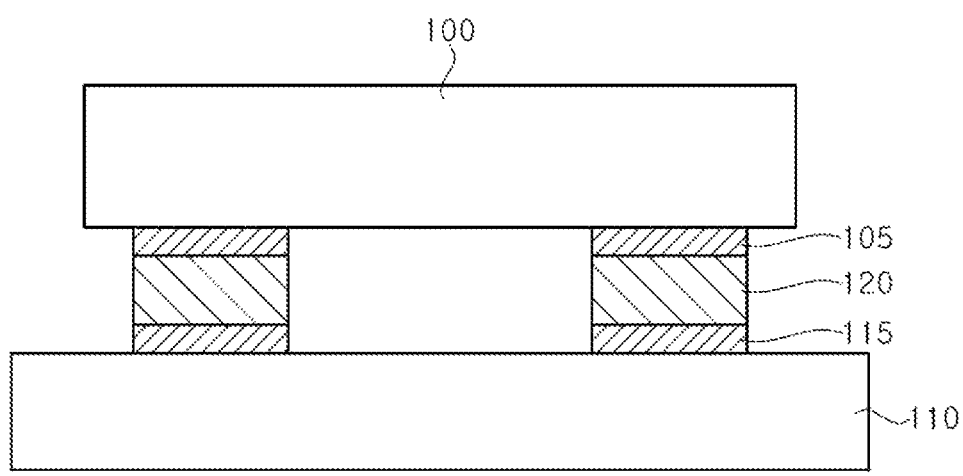

FIGS. 10A and 10B are schematic cross-sectional views illustrating a process of transferring a light emitting device according to an exemplary embodiment.

Referring to FIG. 10A, a circuit board 110 includes pads 115. The pads 115 are connected to circuits in the circuit board 110, and provide contact points for connecting the light emitting device 100 to the circuits. The pads 115 are disposed in each region of the circuit board 110 where the light emitting devices 100 are to be mounted. The pads 115 may be formed of a metal layer including Au. For example, the pads 115 may have a multilayer structure of Cu/Ni/Au.

Barrier layers 121 are provided on the pads 115, and a bonding material layer 123 is provided on the barrier layer 121. The barrier layers 121 may prevent the bonding material layers 123 from diffusing into the pads 115, thereby preventing damage to the pads 115. The barrier layer 121 may be a metal layer mixed with the bonding material layer 123, or a metal layer for blocking diffusion of the bonding material layer 123. For example, the barrier layer 121 may include at least one of Ni, Cr, Ti, Ta, Mo, and W. For example, the barrier layer 121 may have a multilayer structure of Cr/Ni or Ti/Ni.

The bonding material layer 123 may include AuSn, CuSn, or In. In general, the bonding material layers 123 are provided on the pads 115 for group transfer using micro LED technology. The bonding material layer 123 may be formed using, for example, a solder paste including flux and a metallic material. The bonding material layer 123 may be formed on the pads 115 using, for example, a screen printing technique.

In some exemplary embodiments, a metal layer mixed with the bonding material layer 123 such as an Au layer may be interposed between the barrier layer 121 and the bonding material layer 123.

The light emitting device 100 has pads 105. The pads 105 correspond to the pads 115 of the circuit board 110. As shown in the drawing, the pads 105 may be bump pads protruding from the light emitting device 100, but in some exemplary embodiments, the pads 105 may not necessarily have a protruding shape. By group transfer, the plurality of light emitting devices 100 may be transported to correspond to the pads 115 of the circuit board 110.

Referring to FIG. 10B, after the pads 105 of the light emitting device 100 are arranged on the bonding material layers 123 as shown in FIG. 10A, a metal bonding layer 120 is formed by applying heat at a bonding temperature. In particular, the barrier layer 121 and the bonding material layer 123 may be mixed with each other by heat, and at least a portion of the pads 105 may be mixed with the bonding material layer 123. In this manner, the light emitting device 100 may be stably attached to the circuit board 110 by the metal bonding layer 120. In this case, a support substrate used to transfer the light emitting devices 100 to the circuit board 110 is removed from the light emitting devices 100, and thus, the display panel 2000a described in FIG. 9 may be provided.

Figure 11:
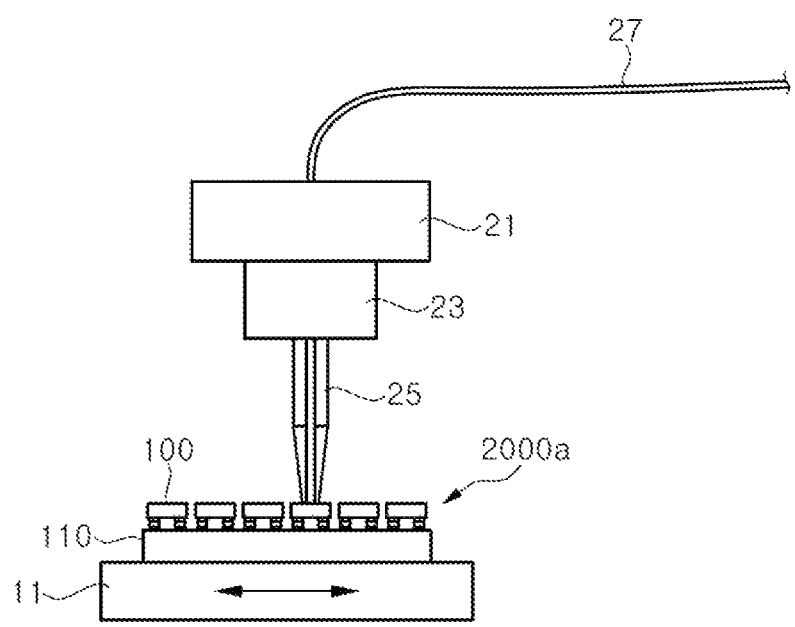
FIG. 11 is a schematic cross-sectional view illustrating a process of removing a defective device according to another exemplary embodiment.

FIG. 11 is a schematic cross-sectional view illustrating a process of removing a defective device according to another exemplary embodiment. In the illustrated exemplary embodiment, a pickup unit 150 of an apparatus 10 is used to remove the defective light emitting device.

Referring to FIG. 11, a display panel 2000a having the defective light emitting device 100 may be directly disposed on a first table 11. Whether the light emitting device 100 is defective or not may be determined in advance, and the defective light emitting device 100 may be placed under a needle 25 by lateral movement of the first table 11. The needle 25 may be placed above the defective light emitting device 100 by the movement of the moving device 21, and vacuum-adsorb the defective light emitting device 100.

Once the needle 25 is in close contact with the defective light emitting device 100, the defective light emitting device 100 may be separated from the circuit board 110 by vibrating the first table 11 or the needle 25 in the lateral direction. Subsequently, the needle 25 may discard the defective light emitting device 100 by lifting the defective light emitting device 100 in a vacuum-adsorbed state.

According to the illustrated exemplary embodiment, since the apparatus 10 removes the defective light emitting device 100 and mount the light emitting device 100a for repairing, a process of repairing the light emitting device may be further simplified.

Figure 12:
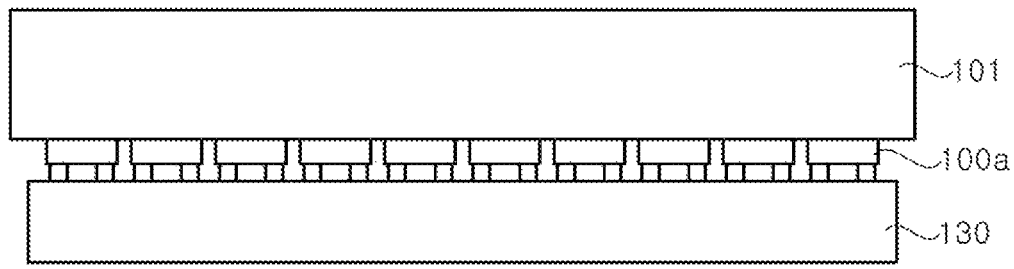
FIG. 12 is a schematic cross-sectional view illustrating a process of transferring a light emitting device for repairing onto a temporary substrate.

FIG. 12 is a schematic cross-sectional view illustrating a process of transferring a light emitting device 100a for repairing onto a temporary substrate 130.

Referring to FIG. 12, the light emitting devices 100a may be formed on a substrate 101. The substrate 101 may be a growth substrate for growing an epitaxial layer, for example, a sapphire substrate, a GaAs substrate, a silicon substrate, a GaN substrate, or a SiC substrate, but the inventive concepts are not limited thereto. The substrate 101 may be divided into a plurality of sections having a predetermined size, and the light emitting devices 100 on each section may be transferred together to the temporary substrate 130.

The light emitting device 100a according to the illustrated exemplary embodiment may have the same size and structure as those of the light emitting device 100 described above. The light emitting devices 100 and 100a may have, for example, sizes smaller than 500 μm×500 μm, and further, smaller than 100 μm×100 μm, which are known in the art as mini-LEDs or micro-LEDs according to their sizes. In an exemplary embodiment, the light emitting devices 100 and 100a may be sub-pixels that emit light of a specific color, and the sub-pixels may form one pixel. For example, a blue micro LED, a green micro LED, and a red micro LED may be disposed adjacent to one another to form one pixel. In this case, the substrate 101 is used to form micro LEDs for emitting light of a specific color. In another exemplary embodiment, each of the light emitting devices 100 and 100a may have a stacked structure that emits light of various colors. For example, each of the light emitting devices 100 and 100a may have a structure in which a blue LED, a green LED, and a red LED are stacked to overlap one another, and thus, each one of the light emitting devices 100 and 100a may form one pixel.

The temporary substrate 130 according to an exemplary embodiment may be a light-transmitting substrate. The temporary substrate 130 may include an adhesive material layer on a surface thereof. The adhesive material layer may be a material layer that may have varying adhesiveness upon curing. For example, the adhesiveness of the adhesive material layer may be reduced when cured. According to an exemplary embodiment, the adhesive material layer may be an ultraviolet tape (UV) tape. When the ultraviolet tape is cured by UV irradiation, the adhesiveness thereof may be reduced to about 1/100 or less, further to about 1/200 or less. For example, the adhesiveness of the adhesive material layer may be about 100 gf/mm before curing, and may be about 0.5 gf/mm after curing.

The light emitting devices 100a on the substrate 101 are attached to the temporary substrate 130 having an uncured adhesive material layer. Each of the light emitting devices 100a on the substrate 101 may be attached to the temporary substrate 130 by the adhesive material layer.

Subsequently, the substrate 101 is removed from the light emitting devices 100a using a technique, such as laser lift off (LLO) or the like. The adhesive material layer may prevent locations of the light emitting devices 100a from being changed while the substrate 101 is separated using laser lift-off. After the substrate 101 is removed, the temporary substrate 130 is placed on a second table 13 of the apparatus 10 with the light emitting devices 100a attached thereon.

Referring back to FIGS. 7 and 8, the temporary substrate 130 disposed on the second table 13 may be transported to the lower portion of the needle 25 by lateral movement of the second table 13. The needle 25 picks up the light emitting device 100a from the temporary substrate 130. When the needle 25 picks up the light emitting device 100a, the second table 13 moves in the lateral direction and returns back to an original location.

Subsequently, the third table 17 moves laterally to the lower portion of the needle 25. The needle 25 moves downward to cause at least a portion of the light emitting device 100a contact the conductive adhesive material in the bath 19 on the third table 17. As such, the conductive adhesive material is attached to a lower surface of the light emitting device 100a.

Subsequently, the third table 17 returns back to an original location by lateral movement, and the first table 11 moves laterally to place the circuit board 110 under the lower portion of the needle 25. In particular, a region of the circuit board 110 from which the defective light emitting device 100 has been removed is placed under the needle 25. Subsequently, the needle 25 moves downward to place the light emitting device 100a on the circuit board 110. The needle 25 may press the light emitting device 100a against the circuit board 110, and thus, the light emitting device 100a may be attached to the circuit board 110 by a conductive adhesive material. Subsequently, the needle 25 releases the light emitting device 100a, and thus, the light emitting device 100a is transferred onto the circuit board 110.

A process of moving the light emitting devices 100a from the temporary substrate 130 to the circuit board 110 using the needle 25 may be continuously carried out, and thus, the light emitting devices 100a may replace each of the defective light emitting devices 100. In this manner, the display panel 2000 in which the light emitting devices 100 and the defective light emitting devices 100a are arranged together is provided.

Figure 13A:
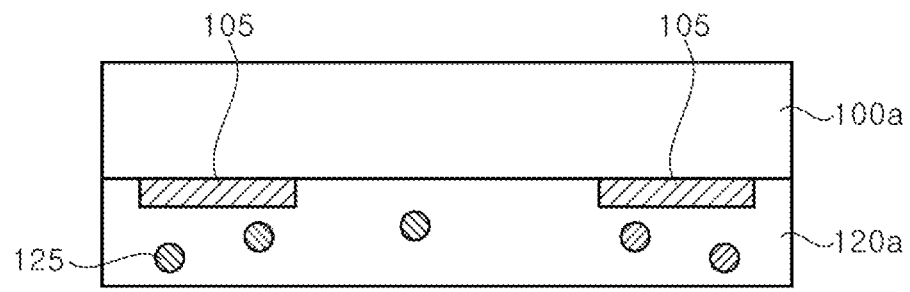
FIGS. 13A and 13B are schematic cross-sectional views illustrating a process of mounting a light emitting device for repairing on a circuit board.
Figure 13A:
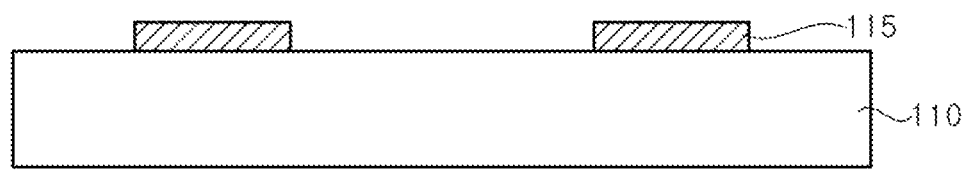
Figure 13B:
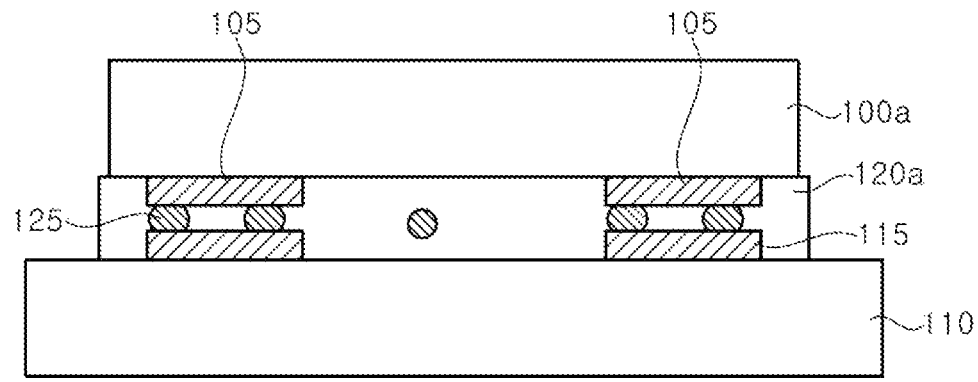

FIGS. 13A and 13B are schematic cross-sectional views illustrating a process of mounting a light emitting device for repairing on a circuit board according to another exemplary embodiment.

Referring to FIG. 13A, after the defective light emitting device 100 is removed, pads 115 may be retained on the circuit board 110. The retained pads 115 may be substantially identical to the pads 115 before the light emitting device 100 is bonded, but may be deformed from the pads 115.

The needle 25 adsorbs the light emitting device 100a for repairing, and dips the light emitting device 100a into the bath 19, so that a portion of the conductive adhesive material, that is, a conductive material layer 120a is attached on the light emitting device 100a. The conductive material layer 120a may have conductive balls 125 in an insulating matrix, and may be, for example, an anisotropic conductive paste or an anisotropic conductive adhesive (ACA).

Referring to FIG. 13B, the needle 25 moves downward and presses the light emitting device 100a against the circuit board 110, so that the light emitting device 100a is attached to the circuit board 110 by the conductive material layer 120a. By pressing the light emitting device 100a, a portion of the conductive material layer 120a may protrude to the outside of the light emitting device 100a.

The conductive balls 125 may be disposed between the pad 105 of the light emitting device 100a and the pad 115 of the circuit board 110, and the light emitting device 100a and the circuit board 110 may be electrically connected by the conductive balls 125. The conductive material layer 120a may be cured by heat, and the apparatus 10 may include a heating unit for curing the conductive material layer 120a.

After the conductive material layer 120a is cured, the needle 25 releases the light emitting device 100a. By repeating this process, each of the defective light emitting devices 100 on the circuit board 110 may be replaced with the light emitting devices 100a for repairing, and thus, the display panel 2000 of FIG. 14 may be provided.

Figure 14:
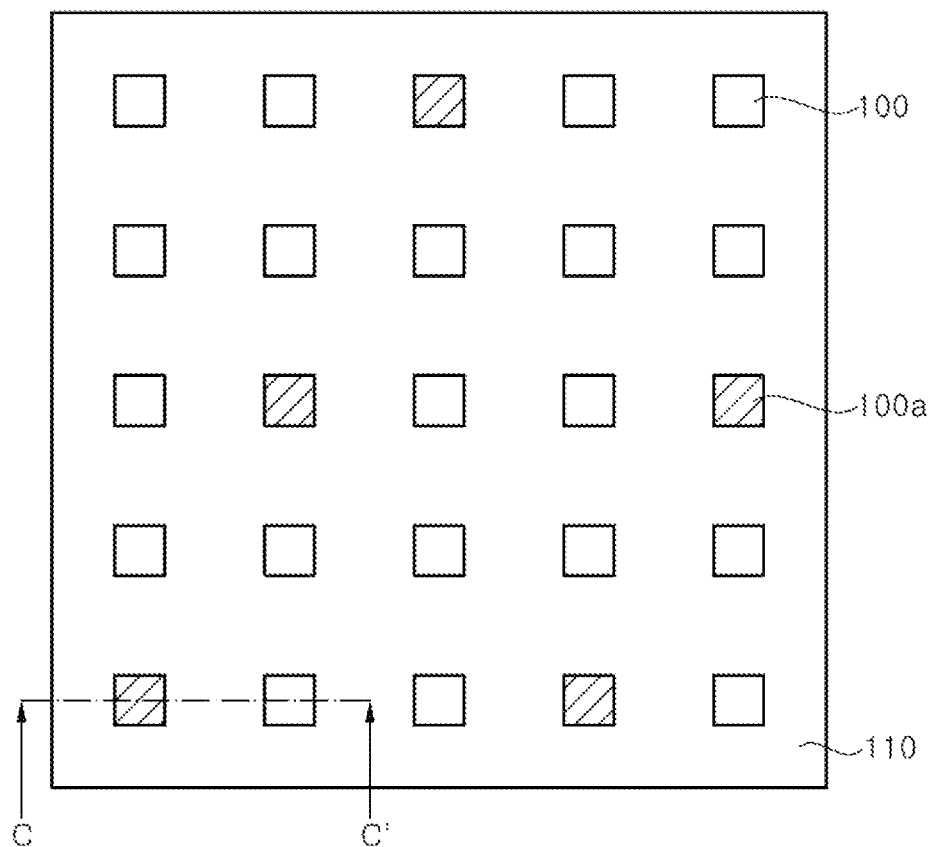
FIG. 14 is a schematic plan view illustrating a display panel having a light emitting device for repairing according to an exemplary embodiment.
Figure 15:
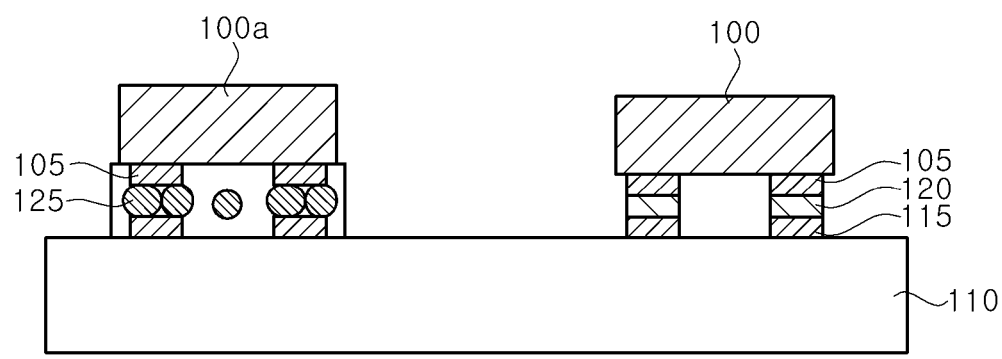
FIG. 15 is an enlarged schematic partial cross-sectional view taken along line C-C' of FIG. 14.

FIG. 14 is a schematic plan view illustrating a display panel 2000 having a light emitting device for repairing according to an exemplary embodiment, and FIG. 15 is an enlarged schematic partial cross-sectional view taken along line C-C' of FIG. 14.

Referring to FIGS. 14 and 15, the display panel 2000 includes a circuit board 110 and light emitting devices 100 and 100a. The light emitting devices 100 and 100a may be small-sized LEDs, commonly referred to as micro LEDs. For example, the light emitting device 100 may have a size smaller than 500 μm×500 μm, and further, smaller than 100

μm×100 μm. However, the inventive concepts are not limited to a particular size of the light emitting devices 100 and 100*a*.

The circuit board 110 may include a circuit for passive matrix driving or active matrix driving. In an exemplary embodiment, the circuit board 110 may include interconnection lines and resistors therein. In another exemplary embodiment, the circuit board 110 may include interconnection lines, transistors, and capacitors. The circuit board 110 may also have pads disposed on an upper surface thereof to allow electrical connection to the circuit therein.

A plurality of light emitting devices 100 and 100*a* is arranged on the circuit board 110. The light emitting device 100 represents a light emitting device of good performance mounted on the circuit board 110 by group transfer, and the light emitting device 100*a* represents a light emitting device for repairing. A structure of the light emitting device 100*a* may be substantially the same as that of the light emitting device 100, but the inventive concepts are not limited thereto. An interval between the light emitting devices 100 and 100*a* may be at least wider than a width of the light emitting device 100 or 100*a*.

In an exemplary embodiment, the light emitting devices 100 and 100*a* may be sub-pixels that emit light of a specific color, and the sub-pixels may form one pixel. For example, a blue LED, a green LED, and a red LED may be adjacent to one another to form one pixel. However, the inventive concepts are not limited thereto, and each of the light emitting devices 100 and 100*a* may have a stacked structure emitting light of various colors. For example, each of the light emitting devices 100 and 100*a* may have a structure in which a blue LED, a green LED, and a red LED are stacked to overlap one another, and thus, one light emitting device 100 and 100*a* may form one pixel.

The light emitting device 100 may have pads 105, and the pads 105 may be adhered to corresponding pads 115 of the circuit board 110 through a bonding layer 120. The bonding layer 120 may be formed by solder bonding, and may include, for example, a metallic bonding material such as AuSn, CuSn, In, or the like.

The light emitting device 100*a* may have pads 105, and the pads 105 may be adhered to the corresponding pads 115 of the circuit board 110 through a conductive material layer 120*a*. The conductive material layer 120*a* includes a conductive portion and a non-conductive portion. The conductive portion electrically connects the pads 105 to the pads 115, and the non-conductive portion surrounds the conductive portion. The conductive material layer 120*a* may be formed using, for example, an anisotropic conductive paste (ACP) or an anisotropic conductive adhesive (ACA). The light emitting device 100*a* may be electrically connected to the circuit board 110 by conductive balls 125 in the conductive material layer 120*a*. The conductive material layer 120*a* according to the illustrated exemplary embodiment may occupy a wider width than that of the light emitting device 100*a*, as shown in the drawings. However, the conductive material layer 120*a* formed according to the illustrated exemplary embodiment does not significantly deviate from a region of the light emitting device 100*a*, and thus, may be spaced apart from adjacent light emitting devices 100.

In an exemplary embodiment, an upper surface of the light emitting device 100*a* may be placed higher than that of the light emitting device 100. In particular, the conductive material layer 120*a* located under the pads 105 of the light emitting device 100*a* may be thicker than the bonding layer 120. However, the inventive concepts are not limited thereto, and the upper surface of the light emitting device 100*a* may be placed at the same elevation as that of the upper surface of the light emitting device 100, or may be placed lower than that of the upper surface of the light emitting device 100.

The display panel 2000 may include at least one light emitting device 100*a*, and the light emitting device 100*a* bonded to the circuit board 110 by the conductive material layer 120*a* may be distinguished from the light emitting device 100 bonded to the circuit board 110 by the metal bonding layer 120.

The display panel 2000 may be mounted in various types of display apparatuses to display an image. The display panel 2000 may be used in a VR display apparatus such as a smart watch, a VR headset, or an AR display apparatus such augmented reality glasses, without being limited thereto.

Although certain exemplary embodiments and implementations have been described herein, other embodiments and modifications will be apparent from this description. As such, the inventive concepts are not limited to such embodiments, but rather to the broader scope of the appended claims and various obvious modifications and equivalent arrangements as would be apparent to a person of ordinary skill in the art.

What is claimed is:

1. A display panel, comprising: a circuit board including first pads; first light emitting devices disposed on the circuit board and including pads; at least one second light emitting device disposed on the circuit board and including pads; metal bonding layers disposed between the pads of the first light emitting devices and the first pads on the circuit board; and a conductive material layer electrically connecting the pads of the second light emitting device to the first pads on the circuit board, wherein the conductive material layer includes a first region and a second region, wherein the first region of the conductive material layer is disposed between one of the pads of the second light emitting device and one of the first pads, and the second region of the conductive material layer extends from the first region and does not overlap the one of the pads of the second light emitting device, and wherein the at least one second light emitting device and at least one of the first light emitting device have a same thickness, and an upper surface of the at least one second light emitting device is placed higher than that of the at least one first light emitting device.

2. The display panel of claim 1, wherein the conductive material layer includes at least one of an anisotropic conductive film, an anisotropic conductive paste, and an anisotropic conductive adhesive.

3. The display panel of claim 2, wherein the first region of the conductive material layer includes conductive balls disposed between the pads of the second light emitting device and the pads of the circuit board.

4. The display panel of claim 1, wherein the metal bonding layer includes at least one of AuSn, CuSn, and In.

5. The display panel of claim 1, wherein each of the first and second light emitting devices is configured to emit each of blue light, green light, and red light.

6. The display panel of claim 1, wherein the conductive material layer contacts the first light emitting device adjacent to the second light emitting device.

7. The display panel of claim 1, wherein the conductive material layer is spaced apart from adjacent first light emitting devices.

8. The display panel of claim 7, wherein the conductive material layer has a wider width than that of the corresponding second light emitting device.

9. A display panel, comprising: a circuit board including first pads; first light emitting devices disposed on the circuit board and including pads; at least one second light emitting device disposed on the circuit board and including pads; metal bonding layers disposed between the pads of the first light emitting devices and the first pads on the circuit board; and a conductive material layer electrically connecting the pads of the second light emitting device to the first pads on the circuit board, the conductive material layer including a first region and a second region, wherein at least a portion of the conductive material layer has a substantially spherical shape, wherein the first region of the conductive material layer is disposed between one of the pads of the second light emitting device and one of the first pads, and the second region of the conductive material layer extends from the first region and does not overlap the one of the pads of the second light emitting device, and wherein the at least one second light emitting device and at least one of the first light emitting device have a same thickness, and an upper surface of the at least one second light emitting device is placed higher than that of the at least one first light emitting device.

10. The display panel of claim 9, wherein the conductive material layer includes at least one of an anisotropic conductive film, an anisotropic conductive paste, and an anisotropic conductive adhesive.

11. The display panel of claim 10, wherein the conductive material layer includes conductive balls disposed between the pads of the second light emitting device and the pads of the circuit board.

12. The display panel of claim 9, wherein the metal bonding layer includes at least one of AuSn, CuSn, and In.

13. The display panel of claim 9, wherein each of the first and second light emitting devices is configured to emit each of blue light, green light, and red light.

14. The display panel of claim 9, wherein at least a portion of the conductive material layer includes a non-conductive portion, and the conductive material layer contacts the first light emitting device adjacent to the second light emitting device.

15. The display panel of claim 9, wherein the conductive material layer is spaced apart from adjacent first light emitting devices.

16. The display panel of claim 15, wherein the conductive material layer has a wider width than that of the corresponding second light emitting device.

* * * * *